United States Patent
White, Jr.

(10) Patent No.: US 6,540,086 B1
(45) Date of Patent: Apr. 1, 2003

(54) PROTECTIVE COVER TAPE HAVING A FOAM LAYER

(75) Inventor: Robert J. White, Jr., Tracy, CA (US)

(73) Assignee: Peak International Ltd., Fremont, CA (US)

( * ) Notice: Subject to any disclaimer, the term of this patent is extended or adjusted under 35 U.S.C. 154(b) by 0 days.

(21) Appl. No.: 09/687,936

(22) Filed: Oct. 13, 2000

(51) Int. Cl.[7] ............................................... B65D 85/86
(52) U.S. Cl. ....................................... 206/714; 206/713
(58) Field of Search ................................. 206/390, 713, 206/714, 725, 820

(56) References Cited

U.S. PATENT DOCUMENTS

| | | | | |
|---|---|---|---|---|
| 4,657,137 A | * | 4/1987 | Johnson | 206/460 |
| 4,699,830 A | * | 10/1987 | White | 206/720 |
| 5,208,103 A | * | 5/1993 | Miyamoto et al. | 428/323 |
| 5,491,013 A | * | 2/1996 | Holley | 206/714 |
| 6,149,010 A | * | 11/2000 | Tanaka et al. | 206/714 |

* cited by examiner

Primary Examiner—David T. Fidei
(74) Attorney, Agent, or Firm—Pillsbury Winthrop LLP

(57) ABSTRACT

Apparatus and methods are presented herein for protecting electronic components from damage during transport or "drop testing." A packaging system of the present invention includes a novel cover tape bonded to a carrier tape, which cover tape includes a foam layer attached thereto on its underside. The foam layer prevents excessive movement of the electronic components within the cavities, thereby protecting the leads and other parts of the components from damage. The method for protecting the components in the cavities of the carrier tape includes attaching the foam layer on the underside of the cover tape before sealing the cover tape on the carrier tape. When the cover tape is bonded to the carrier tape with the components placed in the cavities, the foam layer prevents excessive movement of the components therein.

31 Claims, 6 Drawing Sheets

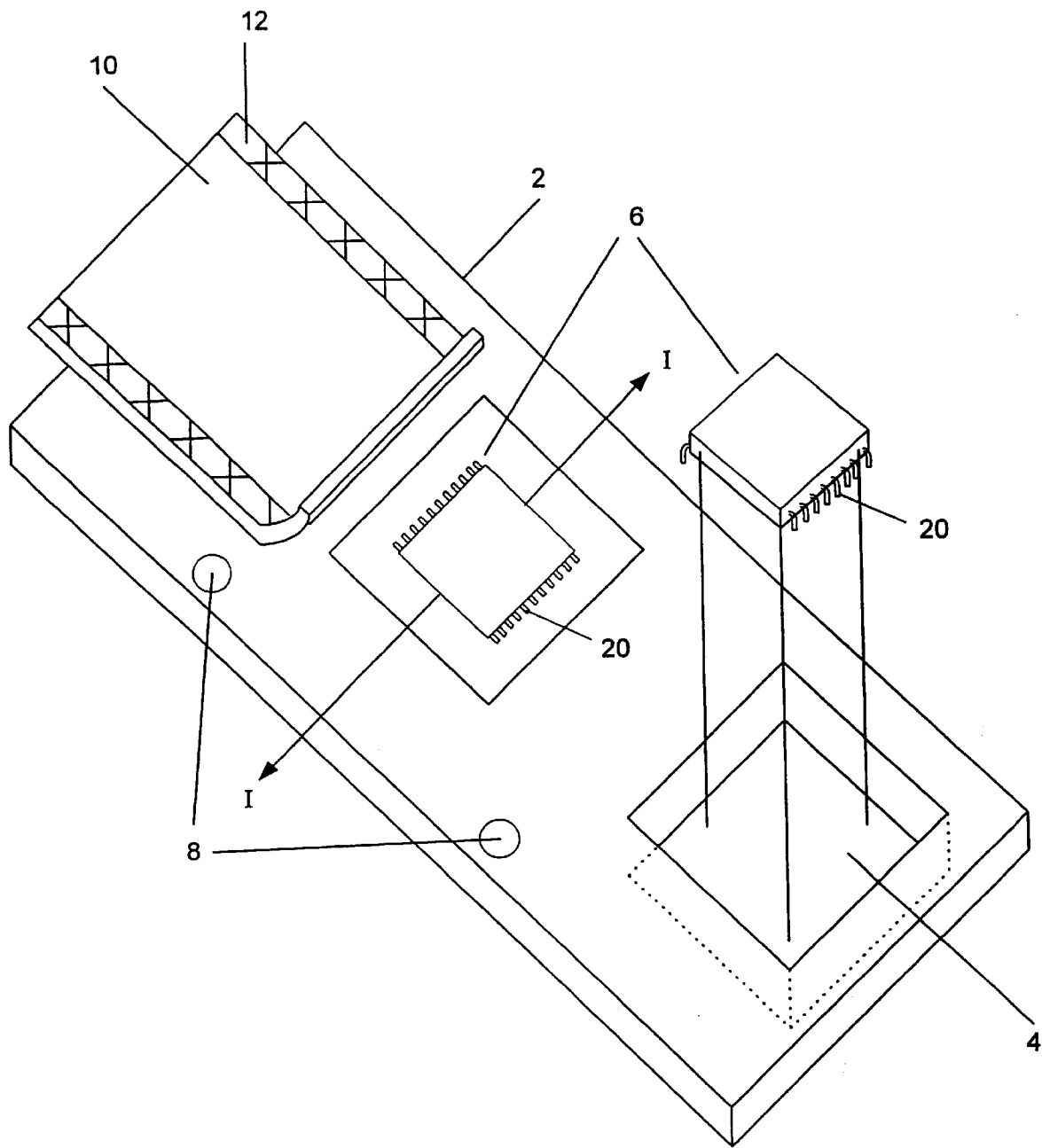
FIG. 1A (PRIOR ART) - PERSPECTIVE VIEW

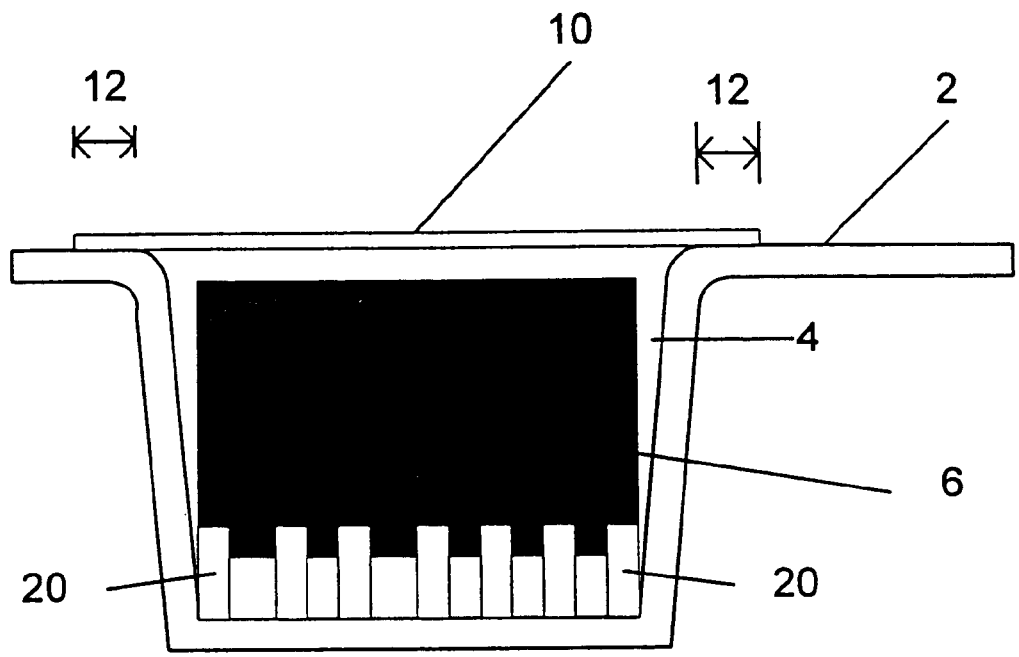
FIG. 1B (PRIOR ART) - SIDE VIEW

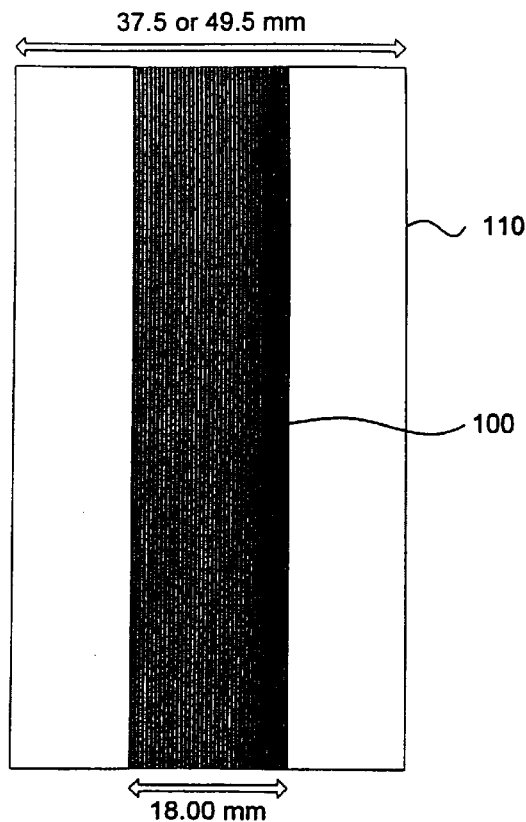
FIG. 3A - TOP VIEW
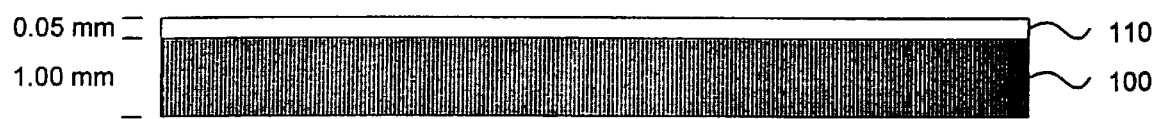
FIG. 3B - SIDE VIEW

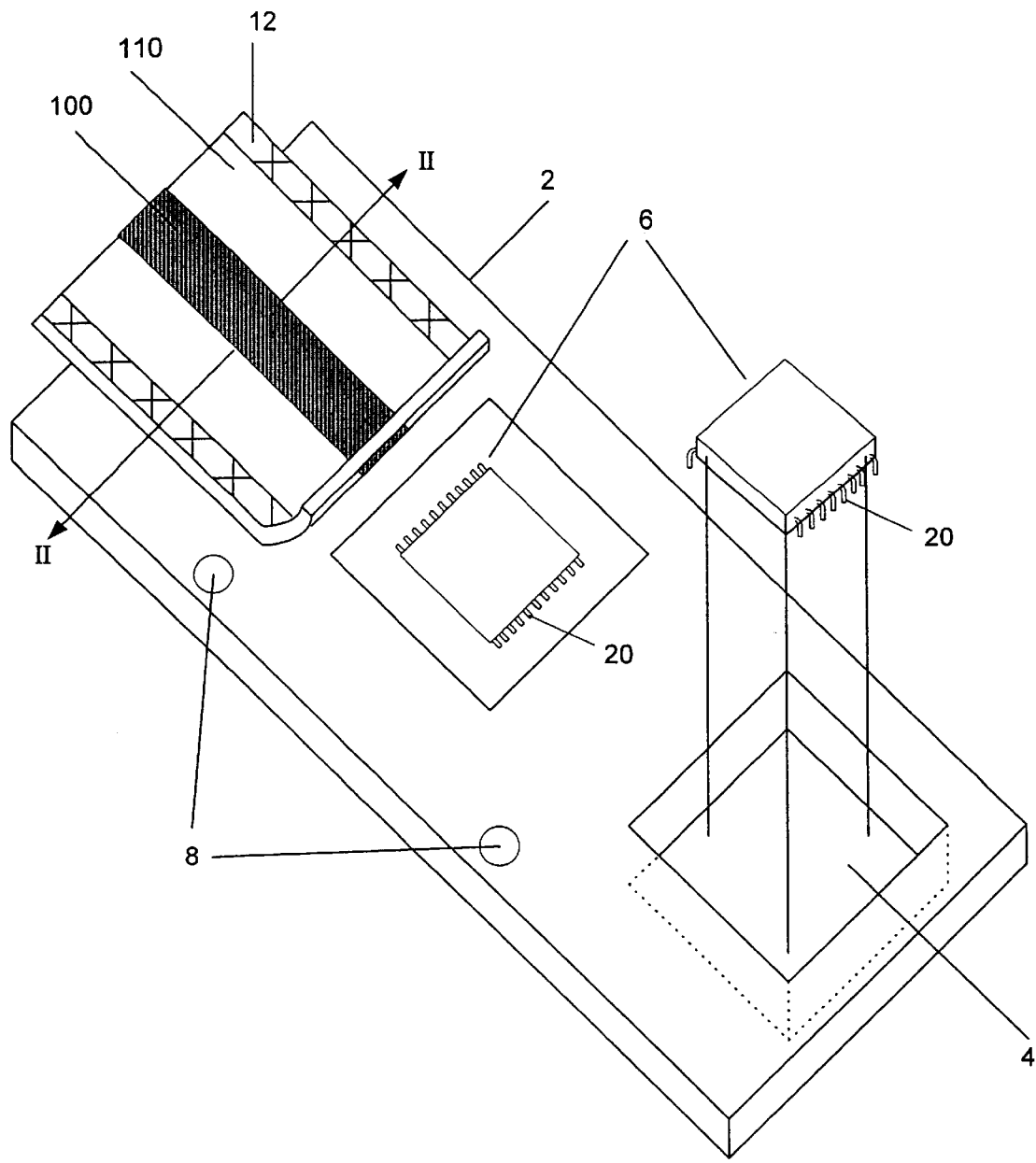
FIG. 4A - PERSPECTIVE VIEW

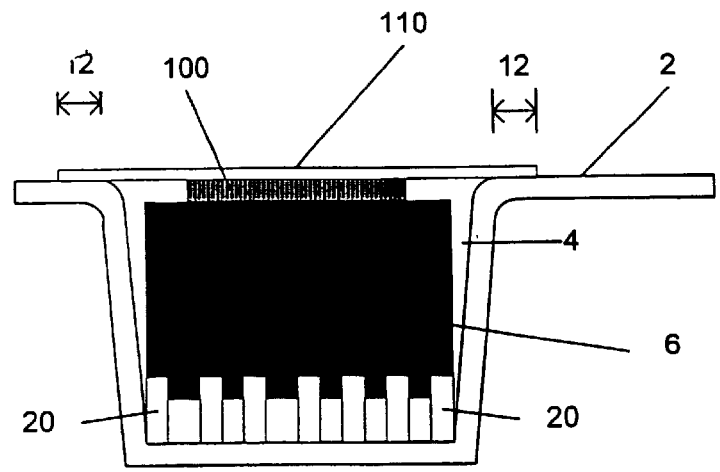
FIG. 4B – SIDE VIEW
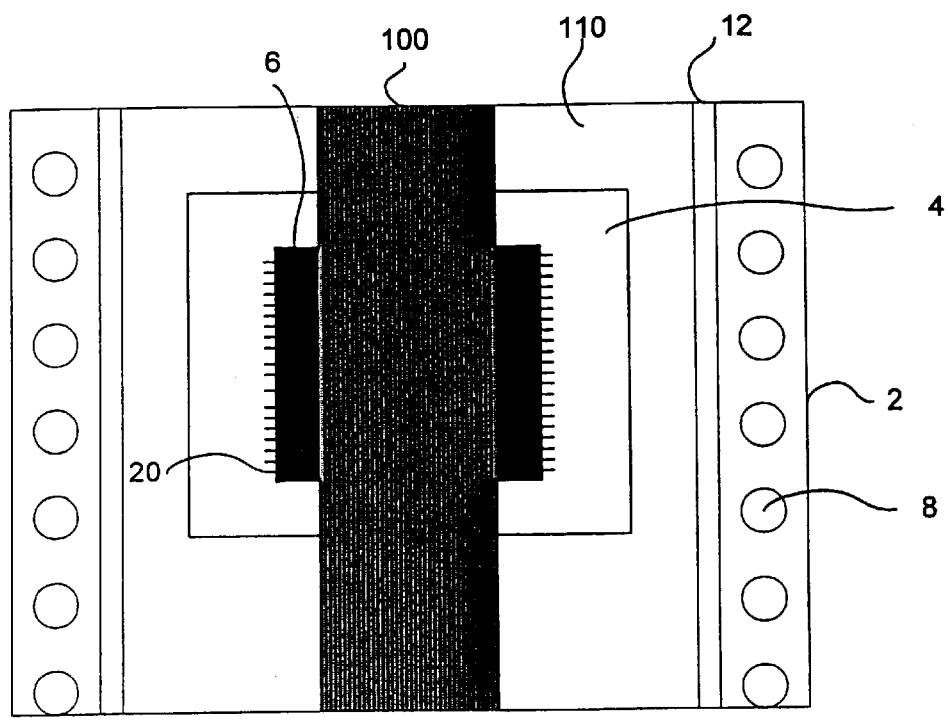
FIG. 4C – TOP VIEW

US 6,540,086 B1

PROTECTIVE COVER TAPE HAVING A FOAM LAYER

FIELD OF THE INVENTION

The present invention relates to a carrier tape and cover tape used for packaging and transporting components. More particularly, the present invention is directed to a cover tape that protects components placed in the cavities of the carrier tape. A foam layer is attached to the underside of the cover tape for protecting the components in the cavities of the carrier tape during transport or "drop testing."

BACKGROUND OF THE INVENTION

In the electronic circuit assembly field, electronic components such as semiconductor chips, devices, integrated circuits, and the like are generally packaged and transported in carrier tapes from one manufacturer to another manufacturer or customer. It is often critical that the components be packaged and transported with minimal damage. By their very nature, these electronic components are lightweight objects and susceptible to damage and accordingly, it is important that these components be packaged and transported in a manner that minimizes/eliminates damage to them. After manufacturing the electronic components in a "clean room" facility, the components are generally packaged and transported to a customer such as a computer wholesaler to mount them onto printed circuit boards.

The semiconductor fabrication industry currently implements a JEDEC standard carrier tape system to package and transport semiconductor components. Conventional carrier tape systems allow the component manufacturers to package and transport the components to their customers, while allowing the customers to efficiently unload the components using a robotic or automated pick and place machine.

FIGS. 1A–1B illustrate various views of a conventional carrier tape system. FIG. 1A illustrates a perspective view, and FIG. 1B illustrates a cross sectional view taken along line I—I of FIG. 1A of the conventional carrier tape system. Reference will be made to FIGS. 1A–1B concurrently for a more complete understanding of the conventional system.

A conventional carrier tape 2 includes multiple thermoformed pockets or cavities 4 formed along its longitudinal direction for storing and transporting the components 6. The carrier tape 2 also includes a row of advancement holes 8 formed longitudinally along one side of the carrier tape 2 for locating and feeding the components 6 to the automated pick and place machine (not shown).

During the packaging process, the components 6 are loaded into the cavities 4 of the carrier tape 2 by the automated pick and place machine. After the components 6 are successfully loaded into the cavities 4, a cover tape 10 is applied over the cavities 4 using, for example, a sealing iron (not shown) to secure the components 6 contained therein. The cover tape 10 prevents the components 6 from exiting the cavities 4 of the carrier tape 2. The cover tape 10 is heat bonded over the carrier tape 2 on the bonding zones 12 along the longitudinal direction. After sealing the cavities 4 of the carrier tape 2 with the cover tape 10, the components 6 are transported to another manufacturer/customer.

The electronic component 6 typically includes multiple leads 20 extending from two opposite sides, as illustrated in FIGS. 1A–1B. In some instances, the leads 20 can extend from all fours sides of the component 6. The leads 20 are fragile and can be easily damaged with minimal contact. In most instances, the cavities 4 are formed in a specific manner depending on the dimensions/design of the component 6 for supporting and protecting the components 6 or leads 20 from damage. However, each component 6 design and dimension requires a unique cavity design. Furthermore, it is well known in the industry that the components 6 are still damaged using these specially designed cavities.

FIG. 2 illustrates a conventional packaging system used in the electronic circuit industry. As discussed above, the components 6 are placed in the cavities 4 of the carrier tape 2 before the components 6 are secured with the cover tape 10. The loaded carrier tape 2 is then wound into a roll or a reel 30 ("reel" hereinafter). The carrier tape 2 and cover tape 10 are made of materials sufficiently flexible to be wound into the reel 30, which materials are described in more detail later herein. After the carrier tape 2 is wound on the reel 30, the reel 30 can be placed within a static control bag before it is placed in its individual box. Thereafter, one or more individual boxes can be placed in a shipping box for storage and transport to another manufacture or customer.

After receiving the shipping box, the reel 30 is unpacked from its individual box and the static control bag. The carrier tape 2 is then unwound from the reel 30 and is positioned on the automated pick and place machine. As the carrier tape 2 advances in a longitudinal direction using advancement holes 8, the automated pick and place machine simultaneously removes the cover tape 10 and picks up the components 6 from the cavities 4 and places them in desired locations (e.g., mounts them to printed circuit boards).

The electronic circuit industry conducts a "drop test" on the final packaging system. As described above, the final packaging system includes the reel 30, carrier tape 2, cover tape 10, and components 6. Again, the packaging system can also include the static control or vacuum-sealed bag, individual and/or shipping boxes for receiving the reel 30. During drop testing when the packaging system is dropped intentionally, it is reported that a great number of components 6 sustain damage using current packaging technology. Most likely, the leads 20 bend from the rapid deceleration of the components 6 against the vertical sidewalls of the cavities 4 after the components 6 "jump." Specifically, the components 6 "jump" within the cavities 4, and the leads 20 collide with the vertical sidewalls, thereby causing the leads 20 to bend. Damage can also result within the components as a result of such collision. It can be appreciated that the conventional carrier tape system does not sufficiently protect the components 6 from damage during drop testing or transport. Achieving minimal component 6 damage is often very difficult and continues to be a major problem in the carrier tape industry.

Undulations may also result in the carrier tape 2 as the components 6 are transported from one facility to another. Such undulations may undesirably change the placement of the components 6 in the cavities 4 of the carrier tape 2, thereby leading to obstructions in using the automated pick and place machine.

Accordingly, there is a need for a packaging system and method designed to protect the electronic components from damage, and particularly, protecting the leads from bending or crushing. There is also a need for a packaging system and method for preventing undulations of the components in the cavities of the carrier tape during transport.

SUMMARY OF THE INVENTION

It is an object of the present invention to provide an apparatus and method for protecting electronic components from damage during transport or "drop testing."

It is another object of the present invention to provide a cover tape that protects electronic components placed in the cavities of a carrier tape.

It is a further object of the present invention to provide a cover tape having a foam layer attached thereto for protecting electronic components in the cavities of the carrier tape.

It is yet another object of the present invention to provide a packaging system and method designed to protect the leads on electronic components from damage.

It is another object of the present invention to provide a packaging system and method for preventing undulations of the electronic components in the cavities of the carrier tape during transport.

The present invention relates to a packaging system and method for protecting electronic components from damage during transport or "drop testing." The packaging system of the present invention includes a novel cover tape bonded to a carrier tape. A foam layer is attached to the underside of the cover tape for protecting the electronic components that are stored in the cavities of the carrier tape. The foam layer prevents excessive movement of the components in the cavities, thereby protecting the leads and other parts of the electronic components from damage. The foam layer is preferably made of a material that is flexible, static resistant, and not susceptible to generating residuals.

The method for protecting the components in the cavities of the carrier tape includes attaching the foam layer on the underside of the cover tape before sealing the cover tape on the carrier tape. The foam layer can be attached to the cover tape using adhesives. When the cover tape is bonded to the carrier tape with the components placed in the cavities, the foam layer is positioned on top of the components. In this manner, the components do not move excessively within the cavities and is protected by the foam layer.

In another embodiment, the foam layer can be attached to the underside of the cover tape as the cover tape is being bonded to the carrier tape. In both embodiments, the foam layer protects the components from damage. In addition, the foam layer also acts to prevent undulations from occurring.

BRIEF DESCRIPTION OF THE DRAWINGS

These and other objects and advantages of the present invention will become apparent and more readily appreciated from the following detailed description of the presently preferred exemplary embodiments of the invention taken in conjunction with the accompanying drawings, of which:

FIG. 1A illustrates a perspective view of a conventional carrier tape system;

FIG. 1B illustrates a cross sectional view taken along line I—I of the conventional carrier tape system;

FIG. 3A illustrates a top view of a cover tape in accordance with the preferred embodiment of the present invention;

FIG. 3B illustrates a side view of the cover tape of FIG. 3A in accordance with the preferred embodiment of the present invention;

FIG. 4A illustrates a perspective view of a carrier tape and cover tape in accordance with the preferred embodiment of the present invention;

FIG. 4B illustrates a cross sectional view taken along line II—II of the carrier tape and cover tape of FIG. 4A; and FIG. 4C illustrates an exploded top view of a section of the carrier tape and carrier tape of FIG. 4A.

DETAILED DESCRIPTION OF THE PREFERRED EMBODIMENTS

Figure 2:
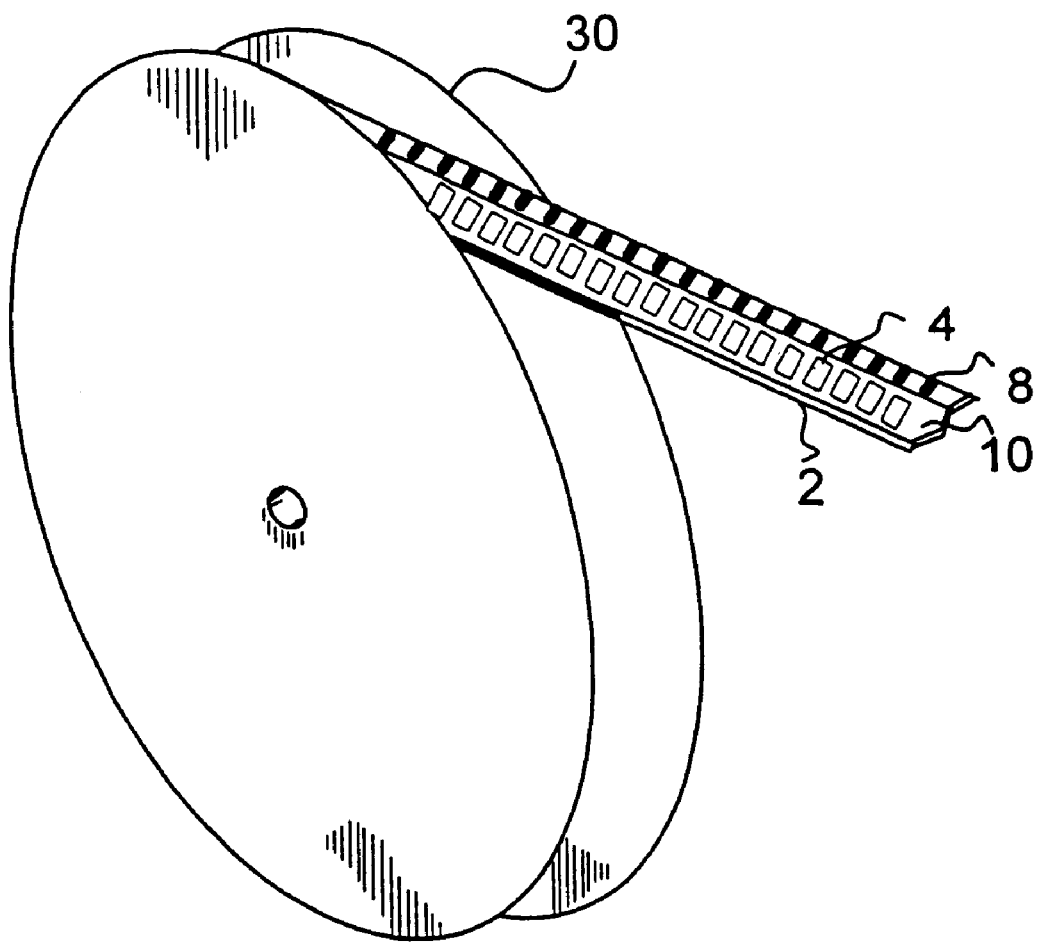
FIG. 2 illustrates a conventional packaging system used in the electronic circuit industry.

The present invention will be described in greater detail, which may serve to further the understanding of the preferred embodiments of the present invention. As described elsewhere herein, various refinements and substitutions of the various embodiments are possible based on the principles and teachings herein.

The preferred embodiments of the present invention will now be described with reference to FIGS. 3–4, wherein like components are designated by like reference numerals throughout the various figures. Further, specific details and parameters are provided herein and are intended to be explanatory rather than limiting.

The present invention discloses a packaging system and method for protecting electronic components from damage during transport or "drop testing." The packaging system includes a novel cover tape bonded to a carrier tape, which cover tape includes a foam layer attached thereto on its underside. The foam layer prevents excessive movement of the electronic components within the cavities, thereby protecting the leads and other parts of the components from damage. The method for protecting the components in the cavities of the carrier tape includes attaching the foam layer on the underside of the cover tape before sealing the cover tape on the carrier tape. When the cover tape is bonded to the carrier tape with the components placed in the cavities, the foam layer prevents excessive movement of the components therein.

FIGS. 3A–3B illustrate a cover tape in accordance with the preferred embodiment of the present invention. FIG. 3A illustrates a top view, and FIG. 3B illustrates a side view of the cover tape 110 in accordance with the preferred embodiment. Reference will be made to FIGS. 3A–3B concurrently for a more complete understanding of the present invention.

The cover tape 110 is preferably made from a heat-activated anti-static material that meets JEDEC industry standards, such as a VH-E1 cover tape. The width of the cover tape 110 should be sufficiently wide enough to cover the cavities of the carrier tape while bonding to the periphery of the carrier tape. In the current state of carrier tape technology, the width of the cover tape 110 should be about 37.5 or 49.5 mm (+0.1 mm), depending on the type and dimensions of the carrier tape. The thickness of the cover tape 110 should be about 0.04–0.06 mm, but other thickness values outside this range can be used so long as the cover tape 110 is sufficiently robust to be heated-bonded to the carrier tape while protecting the components in the cavities. The cover tape 110 can be made from, but not limited to, polyester, polypropylene or polyethylene having heat sensitive adhesives with or without additives. An example of the cover tape 110 that can be used in the present invention is the ST10 cover tape manufactured by Neptco Inc. The ST10 cover tape is a clear polyester film coated with heat-activated adhesive with anti-static properties.

Attached to the underside of the cover tape 110 is a foam layer 100, which layer 100 protects the components during transport or "drop testing." As illustrated, the foam layer 100 is attached to the center portion of the cover tape 110 in its longitudinal direction. Using the cover tape 110 having widths of 37.5 or 49.5 mm, the width of the foam layer 100 can be about 18.00 mm, and the thickness about 1.00 mm. However, those skilled in the art will recognize that other width and thickness values than those stated above can be used in the present invention so long the components are adequately protected during transport or "drop testing."

Also, in other embodiments, one or more foam layers can be attached to other portions of the cover tape besides the center portion.

The foam layer 100 is preferably made from a material that is flexible, static resistant, and not susceptible to generating residuals. An example of the foam layer 100 that can be used in the present invention is one manufactured by LIT Industries that is made from a material such as polyether, polyester, PVC, neoprene, and sponge. Further, a clear or transparent foam layer 100 can be used so that visual inspection of the leads 20 can be performed.

The foam layer 100 can be attached to the underside of the cover tape 110 using adhesives before the cover tape 110 is bonded to the carrier tape. In another embodiment, the foam layer 100 can be attached to the cover tape 110 as the cover tape 110 is being bonded to the carrier tape. Those skilled in the art will recognize that various methods for attaching the foam layer 100 to the underside of the cover tape 110 can be implemented in the present invention. Further, after the foam layer 100 is attached to the cover tape 110, they are wound on a tape receiving device such as the reel 30.

FIGS. 4A–4C illustrate a carrier tape and cover tape in accordance with the preferred embodiment of the present invention. FIG. 4A illustrates a perspective top view, FIG. 4B illustrates a cross sectional view taken along line II—II, and FIG. 4C illustrates an exploded top view of a section of the carrier tape and cover tape of FIG. 4A.

As discussed in the background section, the carrier tape 2 includes multiple thermoformed cavities 4 for storing and transporting the components 6. Although each cavity 4 generally stores and transports one such component 6, in other embodiments, each cavity 4 can store and transport two or more components 6. Along the longitudinal direction of the carrier tape 2, there are also formed advancement holes 8. Again, as described above, these advancement holes 8 are used by an automated pick and place machine in order to place and pick up the components 6 from/into the cavities 4. The carrier tape 2 is made generally made from, but not limited to, thermoplastic resin, polycarbonate, polystyrene or ABS (acrylonitrile butadiene-styrene) with or without additives. Currently, the widths of the carrier tapes 2 in the industry range from 8 to 56 mm.

The cover tape 110 is heat bonded to the carrier tape 2 along the heat bonding zones 12 (i.e., crossed-hatched area) using a conventional iron (not shown). As illustrated in FIG. 4B, the foam layer 100 is attached to the underside of the cover tape 110 and is positioned on top of the component 6. The foam layer 100 can make contact with the component 6 as shown, or can be positioned immediately above the component 6 such that the foam layer 100 does not make any contact with the component 6. Whether the foam layer 100 makes contact with the component 6 depends on the thickness of the foam layer 100 and the dimensions of the components 6/cavities 4.

An important consideration using the foam layer 100 is that the foam layer 100 should be lightweight and flexible enough to be wound on the reel 30. Additionally, the foam layer 100 should be made from a material that is anti-static or static dissipative and does not adhere to the component 6. The foam layer 100 should not produce any residuals or particulate since they can attach to the leads 20 of the component 6 and cause defects. Also, the cover tape 110 with the attached foam layer 100 should be peeled back from the carrier tape 2 with a uniform amount of force per industry standards. In other words, while separating the cover tape 110 from the carrier tape 2, the force required for such separation should be constant with respect to the longitudinal direction of the carrier tape 2.

It is to be understood that in the foregoing discussion and appended claims, the term "components" include any electronic or non-electronic components such as integrated circuits, memory chips, or semiconductor devices, etc.

In the previous descriptions, numerous specific details are set forth to provide a thorough understanding of the present invention. However, as one having ordinary skill in the art would recognize, the present invention can be practiced without resorting to the details specifically set forth.

Although various preferred embodiments have been described in detail above, those skilled in the art will readily appreciate that many modifications of the exemplary embodiments are possible without materially departing from the novel teachings and advantages of this invention.

I claim:

1. An apparatus for protecting a plurality of components, comprising:
    a carrier tape having:
        a plurality of cavities each adapted to receive one of the plurality of components, the plurality of cavities formed along a longitudinal direction of the carrier tape;
        a pair of bonding zones, each bonding zone formed longitudinally along the outer periphery of the carrier tape on opposite sides of the plurality of cavities;
    a cover tape having an underside and adapted to cover the plurality of cavities and bond to the carrier tape at the pair of bonding zones; and
    a foam layer attached to the underside of the cover tape in the longitudinal direction, wherein the foam layer prevents excessive movement of the plurality of components within the respective plurality of cavities.

2. The apparatus according to claim 1, wherein the carrier tape further comprises a plurality of advancement holes formed longitudinally adjacent to one of the pair of bonding zones.

3. The apparatus according to claim 1, wherein the carrier tape is made from one of thermoplastic resin, polycarbonate, polystyrene, and acrylonitrile butandiene-styrene.

4. The apparatus according to claim 1, wherein the cover tape is made from one of polyester, polypropylene, and polyethylene.

5. The apparatus according to claim 1, wherein the cover tape is heat bonded to the carrier tape at the pair of bonding zones.

6. The apparatus according to claim 1, wherein the foam layer is made from one of a polyether, polyester, PVC, neoprene, and sponge.

7. The apparatus according to claim 1, wherein the foam layer is transparent.

8. The apparatus according to claim 1, wherein the foam layer is attached to the underside of the cover tape along a center portion of the cover tape.

9. A method for protecting a plurality of components positioned in a respective plurality of cavities of a carrier tape, the method comprising:
    positioning each of the plurality of components in a different one of the plurality of longitudinally spaced cavities of the carrier tape; and
    sealing a cover tape on a pair of bonding zones, each of the pair of bonding zones disposed in a longitudinal direction of the carrier tape on opposite sides of the longitudinally spaced cavities, wherein the cover tape includes an underside having attached thereto a foam layer in a longitudinal direction, wherein the foam layer prevents excessive movement of the plurality of components within the respective plurality of cavities.

10. The method according to claim 9, wherein the carrier tape is made from one of thermoplastic resin, polycarbonate, polystyrene, and acrylonitrile butandiene-styrene.

11. The method according to claim 9, wherein the cover tape is made from one of polyester, polypropylene, and polyethylene.

12. The method according to claim 9, wherein sealing comprises heat bonding the cover tape on the pair of bonding zones.

13. The method according to claim 9 further comprising attaching the foam layer to the underside of the cover tape using adhesives.

14. The method according to claim 13, wherein attaching the foam layer comprises attaching the foam layer to a center portion of the underside of the cover tape.

15. The method according to claim 9, wherein the foam layer is made from one of a polyether, polyester, PVC, neoprene, and sponge.

16. A system for protecting a plurality of components in a plurality of cavities of a carrier tape, comprising;

means for positioning the plurality of components in the plurality of cavities;

means for sealing the plurality of cavities using a cover tape, wherein the cover tape seals the plurality of cavities on bonding zones of the carrier tape; and means for protecting the plurality of components in the plurality of cavities, wherein the means for protecting comprises attaching a foam layer on an underside of the cover tape before sealing the plurality of cavities, and wherein the foam layer assist in preventing the plurality of components from damage.

17. The system according to claim 16, wherein the means for sealing the plurality of cavities includes positioning the cover tape on the bonding zones in a longitudinal direction of the carrier tape.

18. The system according to claim 16, wherein the carrier tape further comprises a plurality of advancement holes formed longitudinally adjacent to one of the bonding zones.

19. The system according to claim 16, wherein the plurality of components comprises one of semiconductor chips, devices, and integrated circuits.

20. The system according to claim 16, wherein the carrier tape is made from one of thermoplastic resin, polycarbonate, polystyrene, and acrylonitrile butandiene-styrene.

21. The system according to claim 16, wherein the cover tape is made from one of polyester, polypropylene, and polyethylene.

22. The system according to claim 16, wherein the means for sealing comprises heat bonding the cover tape to the carrier tape at the bonding zones.

23. The system according to claim 16 further comprising attaching the foam layer to the underside of the cover tape using adhesives.

24. The system according to claim 23, wherein attaching the foam layer comprises attaching the foam layer to a center portion of the underside of the cover tape.

25. The system according to claim 16, wherein the foam layer is made from one of a polyether, polyester, PVC, neoprene, and sponge.

26. The apparatus according to claim 8, wherein the width of the center portion is less than the 50% of the width of the cover tape.

27. The apparatus according to claim 1, wherein the foam layer is made from an antistatic material.

28. The method according to claim 14, wherein the width of the center portion is less than the 50% of the width of the cover tape.

29. The method according to claim 12, wherein the foam layer is made from an antistatic material.

30. The system according to claim 23, wherein the width of the center portion is less than the 50% of the width of the cover tape.

31. The system according to claim 16, wherein the foam layer is made from an antistatic material.

\* \* \* \* \*